US009293893B2

(12) United States Patent
Pan et al.

(10) Patent No.: US 9,293,893 B2
(45) Date of Patent: Mar. 22, 2016

(54) CHIP ARRAY STRUCTURE FOR LASER DIODES AND PACKAGING DEVICE FOR THE SAME

(71) Applicant: TrueLight Corporation, Hsinchu (TW)

(72) Inventors: Jin-Shan Pan, Hsinchu (TW); Chih-Cheng Chen, Taoyuan County (TW); Hsiu-Ming Hsieh, Taipei (TW)

(73) Assignee: TrueLight Corporation (TW)

( * ) Notice: Subject to any disclaimer, the term of this patent is extended or adjusted under 35 U.S.C. 154(b) by 0 days.

(21) Appl. No.: 14/491,812

(22) Filed: Sep. 19, 2014

(65) Prior Publication Data

US 2015/0078412 A1     Mar. 19, 2015

Related U.S. Application Data

(63) Continuation of application No. 13/546,243, filed on Jul. 11, 2012, now abandoned.

(51) Int. Cl.
*H01S 5/00* (2006.01)
*H01S 5/42* (2006.01)
*H01S 5/022* (2006.01)
*H01L 27/15* (2006.01)

(52) U.S. Cl.
CPC ............... *H01S 5/42* (2013.01); *H01S 5/02276* (2013.01); *H01L 27/156* (2013.01); *H01S 5/423* (2013.01)

(58) Field of Classification Search
CPC ....... H01S 5/02276; H01S 5/423; H01S 5/02; H01S 5/183; H01S 5/42; H01L 27/156
USPC ............................. 372/50.12, 50.122, 50.124
See application file for complete search history.

(56) References Cited

U.S. PATENT DOCUMENTS

| | | | | |
|---|---|---|---|---|
| 6,317,443 | B1 * | 11/2001 | Craig et al. ................ | 372/38.04 |
| 2006/0285567 | A1 * | 12/2006 | Otoma ........................ | 372/50.1 |
| 2008/0025361 | A1 * | 1/2008 | Jerman et al. .............. | 372/50.12 |
| 2008/0165810 | A1 * | 7/2008 | Takeda ........................ | 372/21 |
| 2011/0121323 | A1 * | 5/2011 | Wu et al. ...................... | 257/88 |

* cited by examiner

*Primary Examiner* — Yuanda Zhang (57) ABSTRACT

A chip array structure for laser diodes, formed on an active surface of a semiconductor chip produced from a semiconductor process includes a plurality of light-emitting elements in an array arrangement, at least one insulation wall, at least two wire bond areas and a plurality of connection electrodes. The insulation wall separates the light-emitting elements into at least two light-emitting districts. The wire bond areas are positioned respective to the corresponding light-emitting districts. The connection electrodes electrically couple the wire bond areas with the corresponding light-emitting districts. The wire bond areas have independent electrodes, and the light-emitting districts are electrically isolated by the insulation wall.

4 Claims, 6 Drawing Sheets

CHIP ARRAY STRUCTURE FOR LASER DIODES AND PACKAGING DEVICE FOR THE SAME

BACKGROUND OF INVENTION

1. Field of the Invention

The invention relates to a chip array structure for laser diodes, and more particularly to the chip array structure on the same semiconductor chip that includes at least one insulation wall to separate plural light-emitting elements originally in an array arrangement into a number of isolated light-emitting districts. In this invention, each of the light-emitting districts is corresponding to an individual wire bond area (welding pad) so as to achieve a homogeneous illumination effect by mixing lights from different light-emitting districts. Also, the illumination pattern of the laser diode can be further adjusted by appropriate current controls.

2. Description of the Prior Art

Recently in the art, light-communication technology has become one of the mainstream frames for constructing advanced networking. It is already feasible in the future that data transmission can be completely fulfilled by a light-based network. To enhance performance of the light transmission, various semiconductor laser devices have become the devoted topics for the related manufacturers and researchers in the art. Plenty of those laser devices already in the market place include the vertical cavity surface emitting Laser (VCSEL), the horizontal cavity surface emitting Laser (HCSEL), the resonant cavity light emitting diode (RCLED) and so on.

Figure 1:
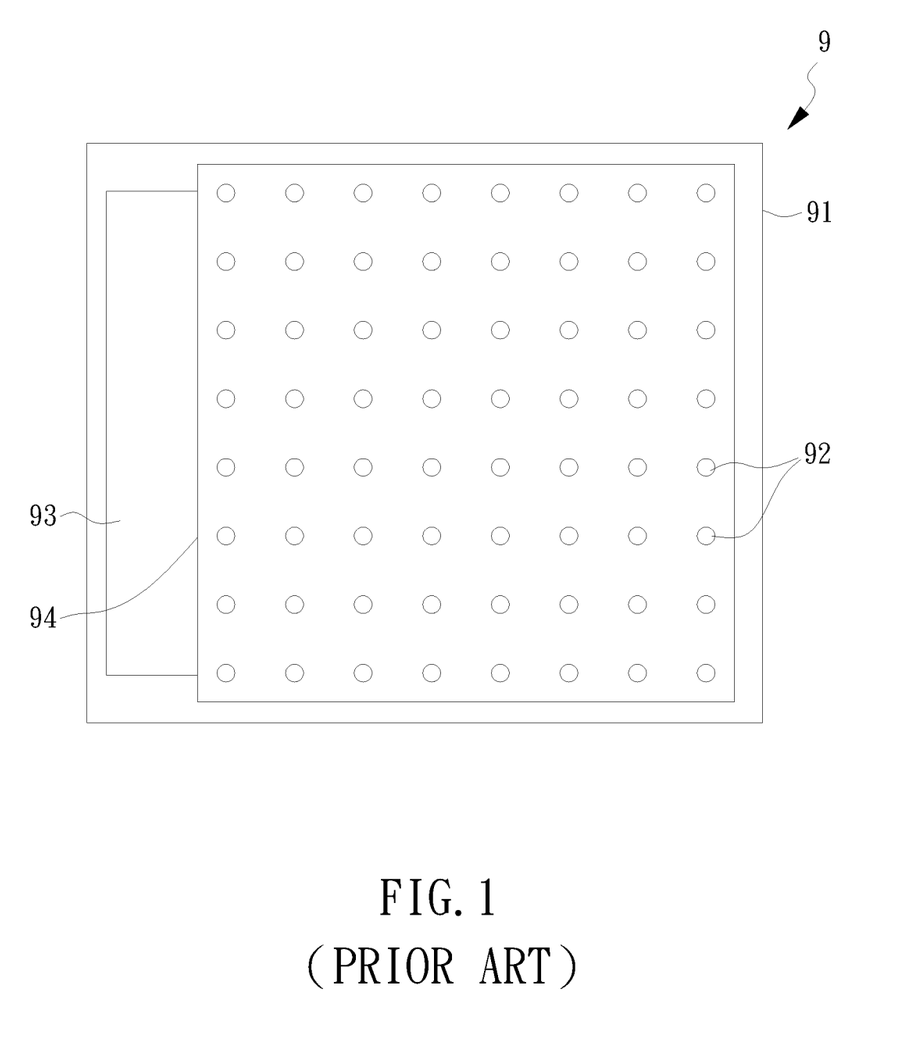
FIG. 1 is a schematic top view of a conventional chip array structure for laser diodes.

Referring to FIG. 1, a top view of a conventional laser diode array chip is schematically shown. In the laser diode array chip 9, plural laser diodes 92 are mounted to the same semiconductor chip 91 in an array arrangement by a semiconductor manufacturing process. A bonding pad 93 located at a lateral side of the array of the laser diodes 92 is electrically connected with each of the laser diodes 92 through a connection electrode 94. In the art, the single bonding pad 93 constructs the common wire bond area for all the laser diodes 92. Even in an alternative design not shown herein, these laser diodes 92 are electrically integrated through bifurcated bonding pads from the same wire bond area. In those conventional designs, currents distributed to the laser diodes 92 on the single bonding pad 93 or the common wire bond cannot be comfortably equalized. In particular, the current decaying rate as well as the electric stability might be significantly varied between the near-side diodes 92 and the far-side diodes 92 with respect to the same bonding pad 93. Thereby, the shortcoming of uneven light powers and performances is inevitable. In addition, for all the laser diodes 92 are mounted on the same bonding pad 93, an equivalent resonant effect can be induced so as to add comprehensive coherence to photos from various laser diodes 92. Thereupon, the conventional laser diode array chip 9 is highly possible to present a donut-type illumination pattern, which may make no difference with the illumination pattern of a single laser diode 92. Apparently, the merits from using plural diodes 92 are vanished.

Particularly, a single semiconductor laser chip to have a big number of laser elements (for example, an 8×8 array to have 64 elements, or a 16×16 array to have 256 elements) is now normal to current designs. As the conventional laser chip is packaged into a light-emitting module, the wire-bond process is usually applied to mount the laser chip onto the substrate of the light-emitting module by gold-wiring the bonding pad of the laser chip to a single electrode area or an electrode stem of the substrate. However, due to the features of high-correlated illumination patterns in the conventional laser chip design, and also to the increased instability in power supply with respect to an increased number of laser elements in a single laser chip, the uneven current flows would inevitably cause an inhomogeneous illumination problem to those laser elements. Obviously, such a performance in the laser chip is far from satisfaction, and thus a comprehensive improvement is definitely needed and urgent.

SUMMARY OF THE INVENTION

Accordingly, it is the primary object of the present invention to provide a chip array structure for laser diodes, in which at least an insulation wall is introduced to separate plural arrayed light-emitting elements into a number of isolated light-emitting districts that are individually energized, such that the problems of uneven power distribution and donut-type illumination pattern can be substantially improved.

It is a secondary object of the present invention to provide a chip array structure for laser diodes, in which the illumination pattern can be adjusted by appropriate current controls upon different light-emitting districts.

In the present invention, the chip array structure for laser diodes, formed on an active surface of a semiconductor chip produced by a semiconductor process, includes a plurality of light-emitting elements in an array arrangement, at least one insulation wall, at least two wire bond areas and a plurality of connection electrodes. In the present invention, the light-emitting elements can be the vertical cavity surface emitting Lasers (VCSEL), the horizontal cavity surface emitting Lasers (HCSEL), or the resonant cavity light emitting diodes (RCLED).

The aforesaid at least one insulation wall located on the active surface of the concerned semiconductor chip is to separate the light-emitting elements into at least two light-emitting districts. The wire bond areas are located on the active surface at positions respective to the corresponding light-emitting districts. The connection electrodes are to electrically couple the wire bond areas with the corresponding light-emitting districts. The polarity of a bottom surface of the semiconductor chip is different to that of the wire bond areas, but the polarities of the wire bond areas are the same, though the wire bond areas are isolated from each other and can be independently powered by an identical external power source.

The light-emitting districts are isolated without any electric communication by the at least one insulation wall. In the present invention, different electric currents can be sent to individual light-emitting district for a purpose of illumination adjustment thereupon. In addition, the aforesaid uneven power distribution problem on the single bonding pad can be lessened by appropriately adjusting the number and the arrangement of light-emitting elements in individual light-emitting district. Thereby, the illumination pattern of the chip can be adjusted by predetermining the illuminations of individual light-emitting districts.

All these objects are achieved by the chip array structure for laser diodes described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a chip array structure for laser diodes and a packaging device for the chip array structure. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 2:
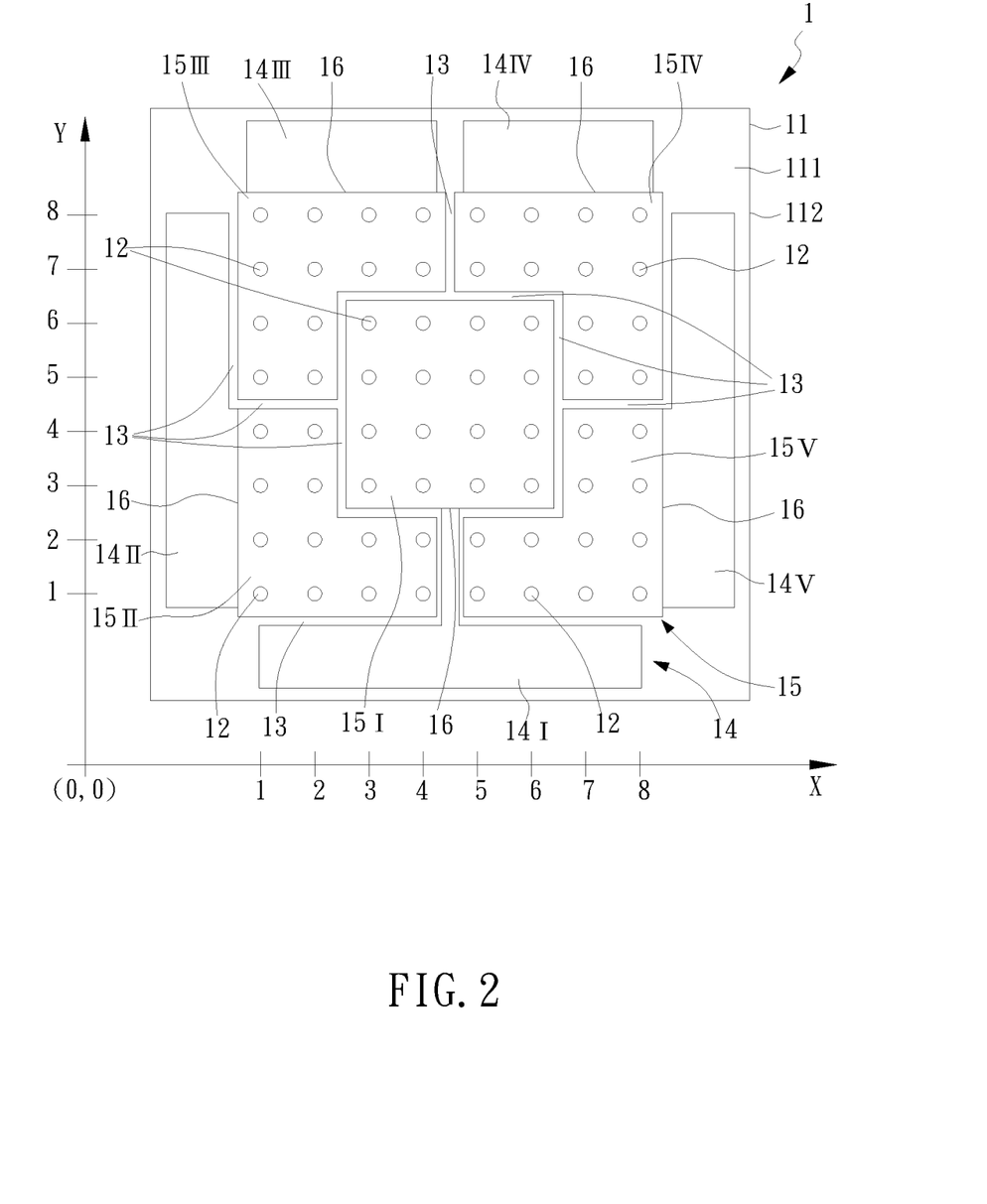
FIG. 2 is a schematic top view of a first embodiment of the chip array structure for laser diodes in accordance with the present invention.

Referring now to FIG. 2, a first embodiment of the chip array structure for laser diodes in accordance with the present invention is schematically shown in a top view. In this first embodiment, the chip array structure 1 is formed on an active surface 111 of a semiconductor chip 11 produced from a semiconductor cutting process and includes a plurality of light-emitting elements 12, at least one insulation wall 13, at least two wire bond areas 14 and a plurality of connection electrodes 16. As shown, the first embodiment 1 is a 8×8 chip array structure having 64 light emitting elements 12, in which, for an explanatory purpose, an X/Y coordinate system is defined to locate each of the light-emitting elements 12 at the corresponding integral node (x,y).

In the present invention, the chip array structure for laser diodes 1 can be a multi-layer cladding structure cut from a III-V semiconductor wafer who has a plurality of semiconductor chips 11 thereon before the semiconductor cutting process. Every of the isolated semiconductor chips 11 is identically structured to have the aforesaid plurality of light-emitting elements 12, the at least one insulation wall 13, the at least two wire bond areas 14 and the plurality of connection electrodes 16. For the cladding technique of wafers and the semiconductor process are not the concerned of the present invention, the related details thereabout would be omitted herein.

The semiconductor chip 11 has two opposing surfaces, the active surface 111 and a bottom surface 112. A metal electrode layer is formed on the bottom surface 112, and the polarity (N or P) of the metal electrode layer is opposite to that of the wire bond areas 14 on the active surface 11. In the first embodiment, the wire bond areas 14 are all P welding pads, while the bottom surface 112 is an N electrode.

In the first embodiment as shown in FIG. 2, the light-emitting elements 12 include 64 elements formed in an 8×8 square array on the active surface 111 of the semiconductor chip 11. The wire bond areas 14 (five shown in this embodiment) are to surround laterally the square array. In another embodiment of the present invention (not shown here), the light-emitting elements 12 can also include 256 elements formed in a 16×16 array. In the present invention, the light-emitting element 12 can be one of the vertical cavity surface emitting Laser (VCSEL), the horizontal cavity surface emitting Laser (HCSEL), the resonant cavity light emitting diode (RCLED), and any light-emitting element the like.

The insulation wall 13 constructed on the semiconductor chip 11 is to separate, in an isolated manner, the light-emitting elements 12 into at least two light-emitting districts 15. On the active surface 111, each of the light-emitting districts 15 is electrically isolated from each other and may include an individual amount of the light-emitting elements 12. In the present invention, different currents can be sent to different light-emitting districts 15, and various currents can be optionally sent into a single light-emitting district 15. With appropriate current controls on the light-emitting districts 15 as well as on a particular single light-emitting district 15, illumination of the chip array structure 1 can thus be adjusted. In addition, the amount and/or the arrangement of the light-emitting elements 12 in each light-emitting district 15 can also be adjusted to achieve any of various illumination patterns. Upon controls of the currents into the light-emitting districts 15, the amount of the light-emitting elements 12 in each the light-emitting district 15, and the arrangement thereof, the aforesaid coherence of photos from the light-emitting districts 15 can be thus broken, and thereby various illumination patterns can be feasible; such that the aforesaid donut-type illumination pattern induced from the laser resonant effect can be avoided. In the first embodiment, at least one insulation wall 13 is introduced to divide the light-emitting elements 12 into five light-emitting districts 15I~15V on the semiconductor chip 11, as shown in FIG. 2. Also, five connection electrodes 16 are applied to connect electrically, in an independent way, the five light-emitting districts 15I~15V to the corresponding wire bond areas 14I~14V.

In the present invention, the wire bond areas 14I~14V are formed by individual conductive metal bonding pads and located at predetermined positions on the active surface 111 of the semiconductor chip 11. Each of the wire bond areas 14I~14V is accounted and electrically connected to a corresponding one of the light-emitting districts 15I~15V, and is polar-independent (P-electrode for example). Namely, the polaritys of the wire bond area 14 and the corresponding light-emitting district 15 connected in between by the connection electrode 16 are identical. By providing the insulation wall 13 to separate electrically the light-emitting districts 15I~15V, each of the light-emitting districts 15I~15V is electrically related only to the corresponding one of the wire bond areas 14I~14V, such that the control of the light-emitting elements 12 within a specific light-emitting district 15 by inputting a specific current to the concerned light-emitting district 15 through the corresponding wire bond area 14 can be achieved.

Further, for the amounts, the arrangements and the input currents of the light-emitting elements 12 in individual light-emitting districts 15I~15V might be various, the illumination and the pattern of a specific or more light-emitting districts 15I~15V can be arbitrarily adjusted so as to obtain a whole homogeneous illumination and also a satisfactory illumination pattern of the chip array structure 1. In addition, the poor illumination performance from the ill distribution of input currents to the light-emitting elements 12 and the unacceptable donut-type illumination pattern from the strong photo coherence induced by the laser resonance on the conventional unique wire bond area (welding pad) can thus be substantially avoided.

Accordingly, referred to FIG. 2, each of the individual light-emitting districts 15I~15V of the first embodiment of the chip array structure 1 for laser diodes in accordance with the present invention can be defined by ranges of corresponding coordinates (x, y) in the X/Y coordinate system as follows.

Light-emitting district 15I: (3~6, 3~6);
Light-emitting district 15II: (1~2, 1~4), (3~4, 1~2);
Light-emitting district 15III: (1~2, 5~8), (3~4, 7~8);
Light-emitting district 15IV: (5~8, 7~8), (7~8, 5~6); and
Light-emitting district 15V: (5~8, 1~2), (7~8, 3~4).

From the (x, y) definitions in FIG. 2, the light-emitting district 15I is surrounded by the other four corner light-emitting districts 15II~15V. Also, each of the light-emitting districts 15I~15V is electrically and independently connected to a corresponding one of the isolated wire bond areas 14I~14V via the respective connection electrodes 16. As shown, the locations of the wire bond areas 14I~14V with respect to the array of the light-emitting elements 12 are defined as follows.

The wire bond area 14I for the light-emitting district 15I is located lower to (in FIG. 2) the array of the light-emitting elements 12;

The wire bond area 14II for the light-emitting district 15II is located left to (in FIG. 2) the array of the light-emitting elements 12;

The wire bond area 14III for the light-emitting district 15III is located upper and left to (in FIG. 2) the array of the light-emitting elements 12;

The wire bond area 14IV for the light-emitting district 15IV is located upper and right to (in FIG. 2) the array of the light-emitting elements 12; and The wire bond area 14V for the light-emitting district 15V is located right to (in FIG. 2) the array of the light-emitting elements 12.

For example, in the first embodiment, for different currents can be individually provided to the wire bond areas 14I~14V through the corresponding connection electrodes 16, different illumination performances can thus be present to the individual light-emitting districts 15I~15V, which are electrically connected with the wire bond areas 14I~14V, respectively; such that a desired illumination pattern of the chip array structure 1 can thus be achieved. In the case that the current to the wire bond area 14I is larger than that to any of the other wire bond areas 14II~14V, any normal light-emitting element 12 within the light-emitting district 15I would be brighter than that within the light-emitting districts 15II~15V, for the differences in input currents. Upon such an arrangement, the light-emitting district 15I will be the brightest one among the light-emitting districts 15I~15V on the chip array structure 1, and thereby a Gaussian illumination pattern can be achieved. On the other hand, in the case that the current to the wire bond area 14I is smaller than that to any of the other wire bond areas 14II~14V, any normal light-emitting element 12 within the light-emitting district 15I would be darker than that within the light-emitting districts 15II~15V, again for the differences in input currents. Upon such an arrangement, the light-emitting district 15I will be the darkest one among the light-emitting districts 15I~15V on the chip array structure 1, and thereby a donut-type illumination pattern can be achieved.

In the following descriptions upon other embodiments of the present invention, the same names and numbers will be given to those elements that are common in all embodiments including the foregoing first embodiment. A tailing letter will be added to the number of any element in the other embodiments that is similar to the element in the first embodiment, though the same name would be still given at the same time.

Figure 3:
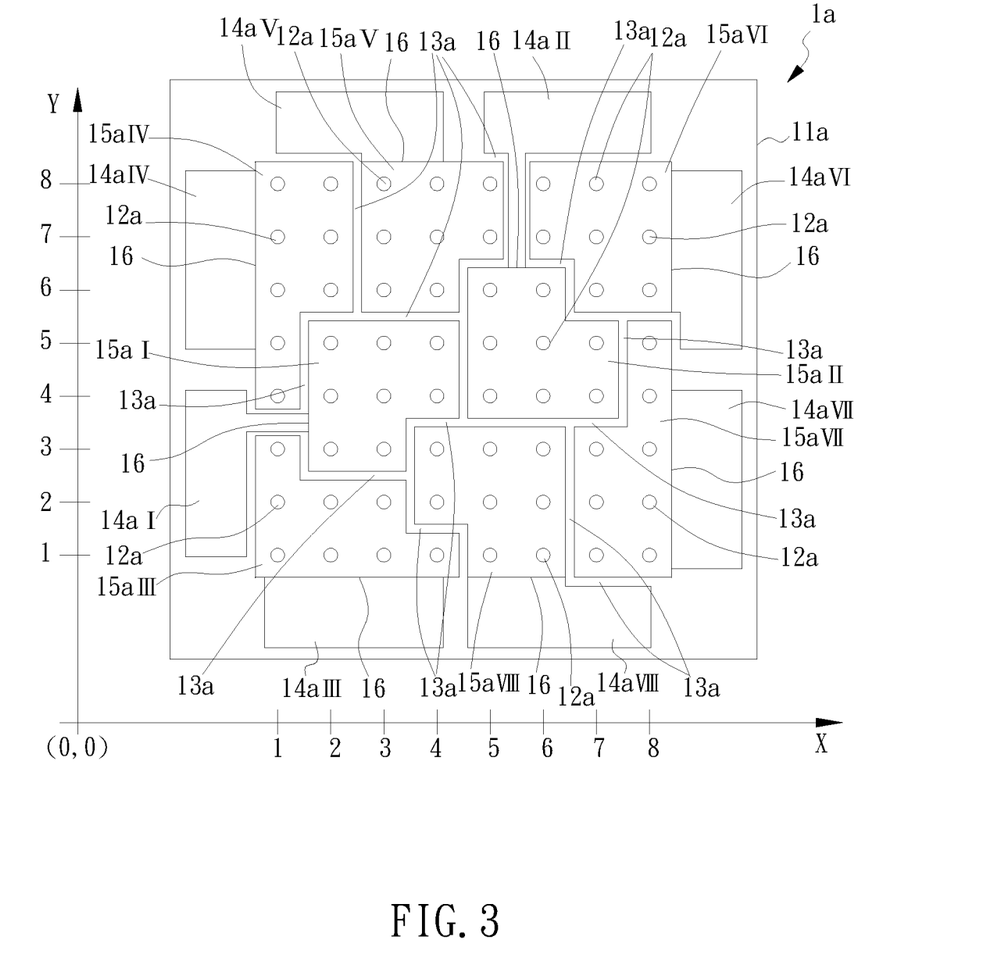
FIG. 3 is a schematic top view of a second embodiment of the chip array structure for laser diodes in accordance with the present invention.

Referring now to FIG. 3, a second embodiment of the chip array structure for laser diodes in accordance with the present invention is schematically shown in a top view. The difference between the second embodiment and the first embodiment is that the second embodiment includes eight light-emitting districts 15aI~15aVIII, and all the eight light-emitting districts 15aI~15aVIII have the same amount of the light-emitting elements 12 though the geometrical configurations thereof might be various. By compared to a formulation of having all the light-emitting districts to have the same geometrical configuration, the second embodiment can take advantages of different shapes of the light-emitting districts 15aI~15aVIII so as to prevent from the disadvantage donut-type illumination pattern resulted from strong photo coherence in laser resonance. In the second embodiment 1a of the chip array structure as shown in FIG. 3, the eight light-emitting districts 15aI~15aVIII are defined by the insulation wall 13a to separate the light-emitting elements 12a on the semiconductor chip 11a, and each of the light-emitting districts 15aI~15aVIII is electrically connected to a respective one of the isolated wire bond areas 14aI~14aVIII through a corresponding connection electrode 16.

Accordingly, referred to FIG. 3, the light-emitting districts 15aI~15aVIII of the second embodiment of the chip array structure 1a for laser diodes in accordance with the present invention, separated by the insulation wall 13a, can be defined by ranges of corresponding coordinates (x, y) in the X/Y coordinate system as follows.

Light-emitting district 15aI: (2~3, 3~5), (4, 4~5);
Light-emitting district 15aII: (5~6, 4~6), (7, 4~5);
Light-emitting district 15aIII: (1~4, 1), (1~3, 2), (1, 3);
Light-emitting district 15aIV: (1, 4~8), (1, 6~8);
Light-emitting district 15aV: (3~4, 6~8), (5, 7~8);
Light-emitting district 15aVI: (6, 7~8), (7~8, 6~8);
Light-emitting district 15aVII: (7, 1~3), (8, 1~5); and
Light-emitting district 15aVIII: (4, 2~3), (5~6, 1~3).

As illustrated in FIG. 3, the light-emitting districts 15aI and 15aII are surrounded by the other light-emitting districts 15aIII~15aVIII. Also, the light-emitting districts 15aI~15aVIII are individually, in an electric independence way, connected to the corresponding wire bond areas 14aI~14aVIII whom are also electrically isolated from each other. As shown, the locations of the wire bond areas 14aI~14aVIII with respect to the array of the light-emitting elements 12a are defined as follows.

The wire bond area 14aI for the light-emitting district 15aI is located lower at a left lateral side to (in FIG. 3) the array of the light-emitting elements 12a;

The wire bond area 14aII for the light-emitting district 15aII is located right at an upper lateral side to (in FIG. 3) the array of the light-emitting elements 12a;

The wire bond area 14aIII for the light-emitting district 15aIII is located left at a lower lateral side to (in FIG. 3) the array of the light-emitting elements 12a, The wire bond area 14aIV for the light-emitting district 15aIV is located upper at the left lateral side to (in FIG. 3) the array of the light-emitting elements 12a;

The wire bond area 14aV for the light-emitting district 15aV is located left at the upper lateral side to (in FIG. 3) the array of the light-emitting elements 12a, The wire bond area 14aVI for the light-emitting district 15aVI is located upper at a right lateral side to (in FIG. 3) the array of the light-emitting elements 12a, The wire bond area 14aVII for the light-emitting district 15aVII is located lower at the right lateral side to (in FIG. 3) the array of the light-emitting elements 12a, and The wire bond area 14aVIII for the light-emitting district 15aVIII is located right at the lower lateral side to (in FIG. 3) the array of the light-emitting elements 12a.

Figure 4:
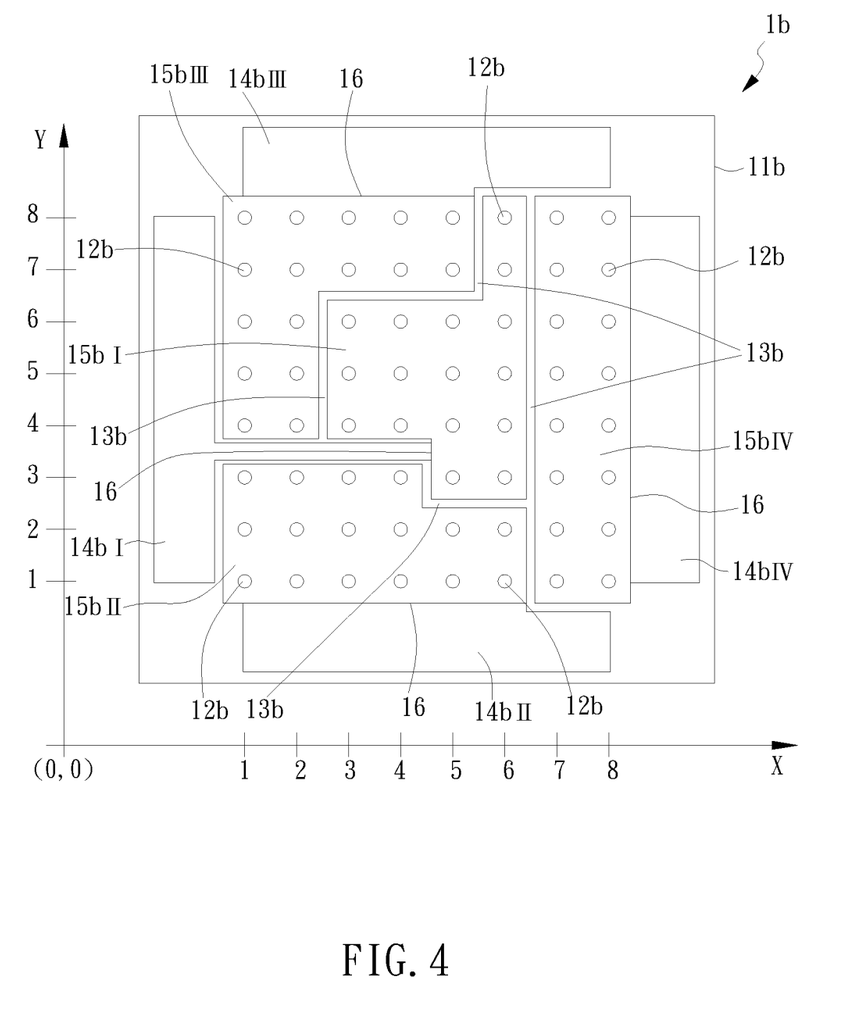
FIG. 4 is a schematic top view of a third embodiment of the chip array structure for laser diodes in accordance with the present invention.

Referring now to FIG. 4, a third embodiment of the chip array structure for laser diodes in accordance with the present invention is schematically shown in a top view. The difference between the third embodiment and the first embodiment is that the third embodiment includes only four light-emitting districts 15bI~15bIV, and each of the four light-emitting districts 15bI~15bIV has a larger amount of the light-emitting elements 12b than that in the first embodiment, though the geometrical configurations thereof are various. By compared to a formulation of having all the light-emitting districts to have the same geometrical configuration, the third embodiment can also take advantages of different shapes of the light-emitting districts 15aI~15aVIII to avoid the disadvantage donut-type illumination pattern resulted from strong photo coherence in laser resonance. In the third embodiment 1b of the chip array structure as shown in FIG. 4, the four light-emitting districts 15bI~15bIV are defined by the insulation wall 13b to separate the light-emitting elements 12b on the semiconductor chip 11b, and each of the light-emitting districts 15bI~15bIV is electrically connected to a respective one of the isolated wire bond areas 14bI~14bIV through a corresponding connection electrode 16.

Accordingly, referred to FIG. 4, the light-emitting districts 15bI~15bIV of the third embodiment of the chip array structure 1b for laser diodes in accordance with the present invention, separated by the insulation wall 13b, can be defined by ranges of corresponding coordinates (x, y) in the X/Y coordinate system as follows.

Light-emitting district 15bI: (3~4, 4~6), (5, 3~6), (6, 3~8);
Light-emitting district 15bII: (1~6, 1~2), (1~4, 3);
Light-emitting district 15bIII: (1~2, 4~8), (3~5, 7~8); and
Light-emitting district 15bIV: (7~8, 1~8).

As illustrated in FIG. 4, the light-emitting districts 15bI is largely surrounded by the other light-emitting districts 15bII~15bIV. Also, the light-emitting districts 15bI~15bIV are individually, in an electric independence way, connected to the corresponding wire bond areas 14bI~14bIV whom are also electrically isolated from each other. As shown, the locations of the wire bond areas 14bI~14bIV with respect to the array of the light-emitting elements 12b are defined as follows.

The wire bond area 14bI for the light-emitting district 15bI is located left to (in FIG. 4) the array of the light-emitting elements 12b;

The wire bond area 14bII for the light-emitting district 15bII is located lower to (in FIG. 4) the array of the light-emitting elements 12b;

The wire bond area 14bIII for the light-emitting district 15bIII is located upper to (in FIG. 4) the array of the light-emitting elements 12b; and The wire bond area 14bIV for the light-emitting district 15bIV is located right to (in FIG. 4) the array of the light-emitting elements 12b.

Figure 5:
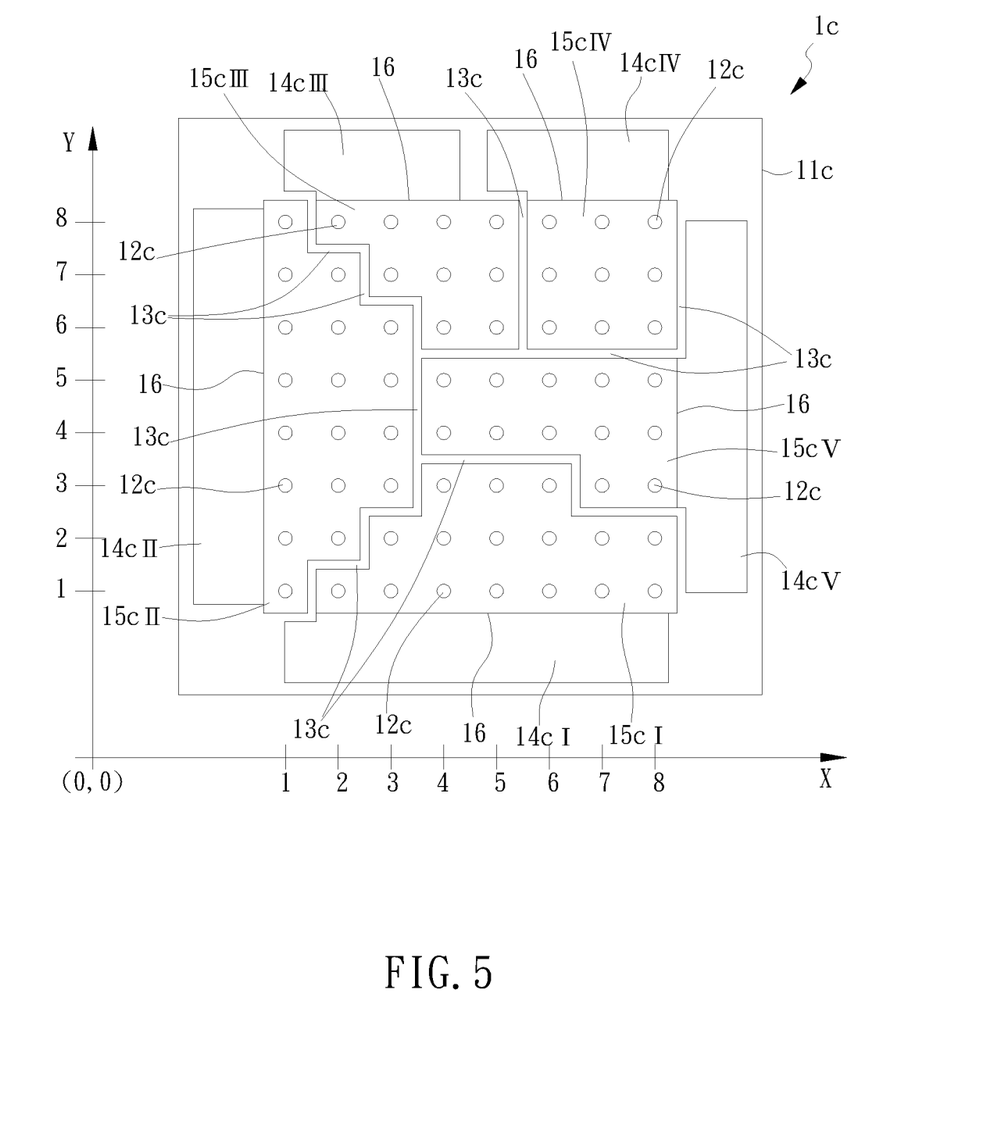
FIG. 5 is a schematic top view of a fourth embodiment of the chip array structure for laser diodes in accordance with the present invention.

Referring now to FIG. 5, a fourth embodiment of the chip array structure for laser diodes in accordance with the present invention is schematically shown in a top view. The difference between the fourth embodiment and the first embodiment is that the fourth embodiment though includes the same five light-emitting districts 15cI~15cVI, but the amounts and the geometrical configurations of the light-emitting elements 12c in the five light-emitting districts 15cI~15cV are different. By compared to a formulation of having all the light-emitting districts to have the same geometrical configuration, the fourth embodiment can be benefited from different shapes of the light-emitting districts 15cI~15cV, by which the disadvantage donut-type illumination pattern resulted from strong photo coherence in laser resonance can be avoided. In the fourth embodiment 1c of the chip array structure as shown in FIG. 5, the five light-emitting districts 15cI~15cV are defined by the insulation wall 13c to separate the light-emitting elements 12c on the semiconductor chip 11c, and each of the light-emitting districts 15cI~15cV is electrically connected to a respective one of the isolated wire bond areas 14cI~14cV through a corresponding connection electrode 16.

Accordingly, referred to FIG. 5, the light-emitting districts 15cI~15cV of the fourth embodiment of the chip array structure 1c for laser diodes in accordance with the present invention, separated by the insulation wall 13c, can be defined by ranges of corresponding coordinates (x, y) in the X/Y coordinate system as follows.

Light-emitting district 15cI: (2~8, 1), (3~8, 2), (4~6, 3);
Light-emitting district 15cII: (1, 1~8), (2, 2~7), (3, 3~6);
Light-emitting district 15cIII: (2~5, 8), (3~5, 7), (4~5, 6);
Light-emitting district 15cIV: (6~8, 6~8); and
Light-emitting district 15cV: (4~8, 4~5), (7~8, 3).

From the (x, y) definitions in FIG. 5, the light-emitting districts 15cIII and 15cIV are located largely upper to the light-emitting districts 15cII and 15cV, and the light-emitting district 15cI is located largely lower to the light-emitting districts 15cII and 15cV. Also, each of the light-emitting districts 15cI-15cV is electrically and independently connected to a corresponding one of the isolated wire bond areas 14cI~14cV via the respective connection electrodes 16. As shown, the locations of the wire bond areas 14cI~14cV with respect to the array of the light-emitting elements 12c are defined as follows.

The wire bond area 14cI for the light-emitting district 15cI is located lower to (in FIG. 5) the array of the light-emitting elements 12c, The wire bond area 14cII for the light-emitting district 15cII is located left to (in FIG. 5) the array of the light-emitting elements 12c, The wire bond area 14cIII for the light-emitting district 15cIII is located left at a lateral side upper to (in FIG. 5) the array of the light-emitting elements 12c;

The wire bond area 14cIV for the light-emitting district 15cIV is located right at the lateral side upper to (in FIG. 5) the array of the light-emitting elements 12c, and The wire bond area 14cV for the light-emitting district 15cV is located right to (in FIG. 5) the array of the light-emitting elements 12c.

Figure 6:
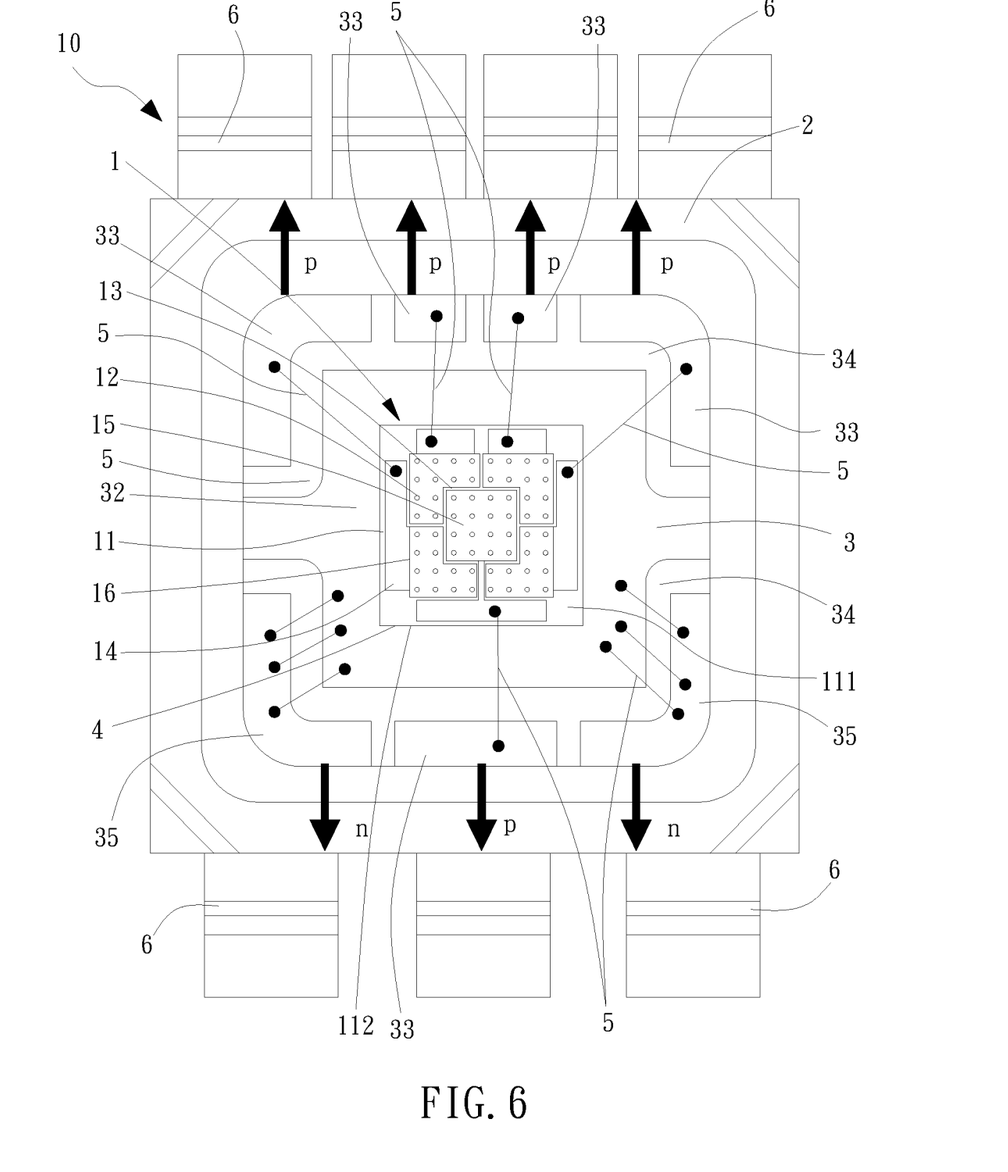
FIG. 6 is a schematic top view of a preferred packaging device for the chip array structure for laser diodes in accordance with the present invention.

Referring now to FIG. 6, a schematic top view of a preferred packaging device for the chip array structure for laser diodes in accordance with the present invention is shown. As illustrated, the 8×8 array structure 1 of the light-emitting elements 12 in the aforesaid first embodiment as shown in FIG. 2 is applied, for example, to the packaging device 10. The packaging device 10 provides a circuit board 2 to carry thereon the chip array structure 1 for laser diodes.

In the present invention, the packaging device 10 includes the chip array structure 1, the circuit board 2, a metal substrate 3, a conductive glue 4 and a plurality of metal wires 5. The chip array structure 1, as described above, is produced from a semiconductor process and includes a plurality of light-emitting elements 12, at least one insulation wall 13, at least two wire bond areas 14, at least two light-emitting districts 15 and a plurality of connection electrodes 16. The circuit board 2 for carrying thereon the metal substrate 3 can couple electrically with a foreign printed circuit board (not shown herein) via leads 6, stems (not shown herein), pins (not shown herein) or terminals (not shown herein) provided under or lateral to the circuit board 2. In the present invention, the circuit board 2 can be made of a low temperature co-fired ceramic (LTCC), a high temperature co-fired ceramic (HTCC), a plastics, or any the like.

The metal substrate 3 engaged on the circuit board 2 has a support surface 31 to carry thereon the chip array structure 1 for laser diodes and the related metal wires 5. As shown in FIG. 6, the metal substrate 3 further includes a first electrode area 32, at least a second electrode area, and at least a third electrode area 35. The first electrode area 32 contacted with the bottom surface 112 of the chip array structure 1 has a surface area larger than the area of the bottom surface 112. Between the bottom surface 112 of the semiconductor chip 11 and the first electrode area 32, the conductive glue 4 is provided to establish the electric coupling as well as the satisfactory adhering in between. In particular, the whole metal substrate 3 can thus perform the N-pole ground due to the contact of the first electrode area 32 and the bottom surface 112 of the semiconductor chip 11. On the other hand, the second electrode area 33 is to perform the respective P-pole electrode isolated to the first electrode area 32. In the present invention, the conductive glue 4 is preferable to be a solder paste, which is featured in excellent thermo-conductivity for bridging the chip array structure 1 and the first electrode area 32. By compared to the conventional silver paste, the adhering provided by the solder paste can present better heat conduction and dissipation.

In the present invention, the metal substrate 3 is made of a copper, aluminum, gold, copper alloy, aluminum alloy, or any metal or alloy the like. Also, the first electrode area 32, the second electrode area 33 and the third electrode area 35 on the metal substrate 3 can be made from plating, printing, or depositing of a silver, copper, gold, or any metal or alloy the like, so as to enhance the electric conductivity of concerned areas and the adhesion in between with the wiring. In the present invention, the metal substrate 3 made of the copper, aluminum, gold, or alloy of the foregoing metals can present better heat conduction and dissipation than the conventional Ni—Fe alloy substrate. The first electrode area 32 and the second electrode areas 33 are electrically separated by an insulation structure 34. Similarly, the first electrode area 32 and the third electrode areas 35 are also electrically separated by the same insulation structure 34. In the present invention, the second electrode areas 33 and the third electrode areas 35 are independent electrode areas distributed largely around the chip array structure 1, mainly at the upper and the lower sides thereof. The insulation structure 34 can be made of an insulation paint, ceramic, or any insulation material the like.

As shown in FIG. 6, the packaging device 10 for the chip array structure 1 in accordance with the present invention includes five second electrode areas 33 (P electrode) located respectively at the upper left corner, the left-hand side of the upper side, the right-hand side of the upper side, the upper right corner and the lower side with respect to the chip array structure 1, in which the second electrode areas 33 at the upper left and right corners are formed as L shapes to shield the respective corners of the chip array structure 1. Each of the second electrode areas 33 is electrically coupled with the corresponding wire bond area 14 of the chip array structure 1 via the respective metal wires 5 structured by a wire-bonding process. In addition, two of the third electrode areas 35 (N electrode) also formed as corresponding L shapes are located to the lower left and right corners of the chip array structure 1, for accounting to the second electrode areas 33 (P electrode) at the upper left and right corners as described above. The third electrode areas 35 and the first electrode area 32 are electrically coupled by the respective metal wires 5 in a previous wire-bonding process.

As shown in FIG. 6, the metal wires 5 are produced from a wire-boding process to bridge the individual wire bond areas 14 and the corresponding second electrode areas 33, and to bridge the first electrode area 32 and the individual third electrode areas 35. Preferably, the metal wires 5 are made of gold. In the present invention, by providing a wire-bonding process, the metal wires 5 can extend between the wire bond areas 14 of the chip array structure 1 and the second electrode areas 33 at the aforesaid five positions so as to establish electric connections in between. In this wire-bonding process, no matter how many the metal wires 5 are, the metal wires 5 are not crossed each other, not across over the array of the light-emitting elements 12, and thus not to shade the lights from the light-emitting elements 12.

In the present invention, the packaging device 10 for the chip array structure 1 further includes a plurality of leads 6 extended from the circuit board 2 and electrically coupled with the respective second electrode areas 33 (P electrode), or either the respective third electrode areas 35 (N electrode) or the first electrode area 32 (N electrode), through the circuit board 2. By providing the leads 6, the packaging device 10 for the chip array structure 1 of the present invention can be then applied to a surface mount device (SMD). Further, for a broader surface area is defined to the second electrode area 33 and also for the plurality of the wire bond areas 14 are electrically independent, heat generated by the array of the light-emitting elements 12 can be effectively dissipated. By providing different currents to the wire bond areas 14, various illumination patterns can be achieved. Further, for the packaging device 10 for the chip array structure 1 of the present invention can allow more metal wires 5 to transmit power signals, design easiness and flexibility in current distribution, resistance reduction and circuit layout can be obtained. Moreover, less heat generation is also one of many merits of the present invention.

While the present invention has been particularly shown and described with reference to a preferred embodiment, it will be understood by those skilled in the art that various changes in form and detail may be without departing from the spirit and scope of the present invention.

What is claimed is:

1. A packaging device for a chip array structure for laser diodes, comprising:
   a metal substrate, having a support surface to carry thereon a first electrode area, at least one second electrode area and at least one third electrode area;
   an insulation structure for electrically separating the first electrode area, each of the at least one second electrode area and each of the at least one third electrode area;
   a semiconductor chip, produced by a semiconductor process, having thereof an active surface to include thereon a plurality of light-emitting elements in an array arrangement, at least one insulation wall, at least two wire bond areas, and a plurality of connection electrodes; said at least one insulation wall formed on said semiconductor chip by said semiconductor process separating the plurality of light-emitting elements into at least a first light-emitting district and a second light-emitting district; each of the first and second light-emitting districts comprising at least two light-emitting elements; said at least two wire bond areas comprising a first wire bond area and a second wire bond area, said first wire bond area being located at a position respective to the first light-emitting district, while the second wire bond area being located at another position respective to the second light-emitting district; said plurality of connection electrodes individually for electrically connecting the first wire bond area and the second wire bond area to the respective at least the first light-emitting district and the second light-emitting district;

a conductive glue, located, thus for establishing electric connection, between a bottom surface of the semiconductor chip and the first electrode area, and a plurality of metal wires connecting at least between one of the first or second wire bond areas and the at least one second electrode area, and also between the first electrode area and the at least one third electrode area;

wherein each of the at least the first light-emitting district and the second light-emitting district is electrically independent, the bottom surface of the semiconductor chip includes thereon an electrode layer having a polarity different to that of the at least the first wire bond area and the second wire bond area, and the at least the first wire bond area and the second wire bond area have individual but identical polarity;

wherein the first wire bond area is input with a current which is different from another current input to the second wire bond area so as to control a brightness of said first light-emitting district to be different from another brightness of said second light-emitting district;

wherein a geometrical configuration of the first light-emitting district is different from another geometrical configuration of the second light-emitting district;

wherein an amount of the light-emitting elements of the first light-emitting district different from another amount of the light-emitting elements of the second light-emitting district.

2. The packaging device for a chip array structure for laser diodes according to claim 1, wherein said metal substrate is made of a material selected from a group of copper, aluminum, gold, and related alloys, and said plurality of light-emitting elements are selected from a group of vertical cavity surface emitting Lasers (VCSEL), horizontal cavity surface emitting Lasers (HCSEL), and resonant cavity light emitting diodes (RCLED).

3. The packaging device for a chip array structure for laser diodes according to claim 1, further including a circuit board engaged thereon said metal substrate, the circuit board being made of a material selected from a group of a low temperature co-fired ceramic (LTCC), a high temperature co-fired ceramic (HTCC) and a plastics.

4. The packaging device for a chip array structure for laser diodes according to claim 3, further including a plurality of leads extended from said circuit board and electrically coupled with said at least one second electrode area, or either said at least one third electrode area or said first electrode area.

* * * * *